United States Patent [19]

Kumagai

[11] 4,225,829
[45] Sep. 30, 1980

[54] LOCAL OSCILLATOR CIRCUIT HAVING TWO PHASE LOCKED LOOPS HAVING RESPECTIVE FREQUENCY DIVIDERS WITH A COMMON DIVISION RATIO

[75] Inventor: Tadashi Kumagai, Soma, Japan

[73] Assignee: Alps Electric Co., Ltd., Tokyo, Japan

[21] Appl. No.: 963,348

[22] Filed: Nov. 24, 1978

[30] Foreign Application Priority Data

Dec. 22, 1977 [JP] Japan .................................. 52/154736

[51] Int. Cl.² ............................................ H03B 3/04
[52] U.S. Cl. ...................................... 331/1 A; 331/2; 331/25
[58] Field of Search ...................... 331/2, 1 A, 11, 18, 331/25; 325/419, 420, 421, 423

[56] References Cited

U.S. PATENT DOCUMENTS

| | | | |
|---|---|---|---|
| 4,025,953 | 5/1977 | Sinderis | 325/420 X |
| 4,031,549 | 6/1977 | Rast et al. | 325/419 X |
| 4,041,535 | 8/1977 | Rzeszewski | 325/421 X |
| 4,114,110 | 9/1978 | Nossen | 331/2 |

*Primary Examiner*—Siegfried H. Grimm
*Assistant Examiner*—Edward P. Westin

*Attorney, Agent, or Firm*—Guy W. Shoup; Gerard F. Dunne

[57] ABSTRACT

A first phase locked loop produces a local oscillator signal. The output of a second phase locked loop is connected to the input of the first phase locked loop. A first variable frequency divider is connected in the first phase locked loop. A second variable frequency divider having the same frequency division ratio as the first frequency divider is connected between a variable frequency oscillator and the input of the second phase locked loop. An adder adds a base frequency of preferably 1 MHz to the output frequency of the second frequency divider. With the frequency of the variable frequency oscillator set at a center frequency, the frequency of the local oscillator signal is equal to the frequency division ratio of the frequency dividers multiplied by 1 MHz. Any variation in the frequency of the variable frequency oscillator from the center frequency is algebraically added to the local oscillator frequency, regardless of the frequency division ratio, as an offset frequency. The frequency range of the variable frequency oscillator is low compared to the frequency range of the local oscillator signal, thereby enabling low frequency drift. A gate disables the first phase locked loop when the second phase locked loop is not in lock.

10 Claims, 2 Drawing Figures

LOCAL OSCILLATOR CIRCUIT HAVING TWO PHASE LOCKED LOOPS HAVING RESPECTIVE FREQUENCY DIVIDERS WITH A COMMON DIVISION RATIO

BACKGROUND OF THE INVENTION

The present invention relates to local oscillator circuits comprising phase locked loops and, particularly, to such oscillator circuits especially advantageous for use in a tuner for a television receiver.

Television tuners comprising voltage controlled oscillators, phase locked loop synthesizers and the like are becoming increasingly popular due to their stable operation, ease and economy of manufacture and low maintenance. Typical of such a tuner is one which comprises a voltage controlled oscillator and a variable capacitance diode connected to an input of the voltage controlled oscillator. A plurality of potentiometers and push button switches are provided for the respective television channels. The sliders of the potentiometers are set to positions such that when a potentiometer for a particular channel is selected by pressing the respective push button, the voltage appearing at the slider of the potentiometer is applied to the variable capacitance diode through the switch and causes the voltage controlled oscillator to produce a proper local oscillator frequency for the selected channel.

However, such a tuning apparatus must be provided with means for fine tuning, or fine adjustment of the local oscillator frequencies. Such adjustment is necessary, for example, when channel frequencies have deviated from their normal values such as in a cable television system or when two nearby stations broadcast on the same channel with the channel frequencies differing slightly.

The fine tuning function may be considered as providing an offset for the local oscillator frequencies. It is desirable that the range of the offset be the same for all channels and also that the offset range not deviate in frequency. These goals have not been heretofore adaquately attained in the prior art.

SUMMARY OF THE INVENTION

A local oscillator circuit embodying the present invention comprises a first phase locked loop and a second phase locked loop having an output connected to an input of the first phase locked loop. A first frequency divider is provided in the first phase locked loop for dividing the output frequency thereof. A second frequency divider having a same frequency division ratio as the first frequency divider is connected between an output of a variable frequency oscillator and an input of the second phase locked loop.

It is an object of the present invention to provide a local oscillator circuit comprising phase locked loops having a frequency offset range which is the same at any local oscillator frequency.

It is another object of the present invention to provide a local oscillator circuit having a frequency offset range with very low frequency drift.

It is another object of the present invention to provide a generally improved local oscillator circuit.

Other objects, together with the following, are attained in the embodiment described in the following description and shown in the accompanying drawing.

DESCRIPTION OF THE PREFERRED EMBODIMENT

While the local oscillator circuit of the invention is susceptible of numerous physical embodiments, depending upon the environment and requirements of use, substantial numbers of the herein shown and described embodiment have been made, tested and used, and all have performed in an eminently satisfactory manner.

Figure 1:
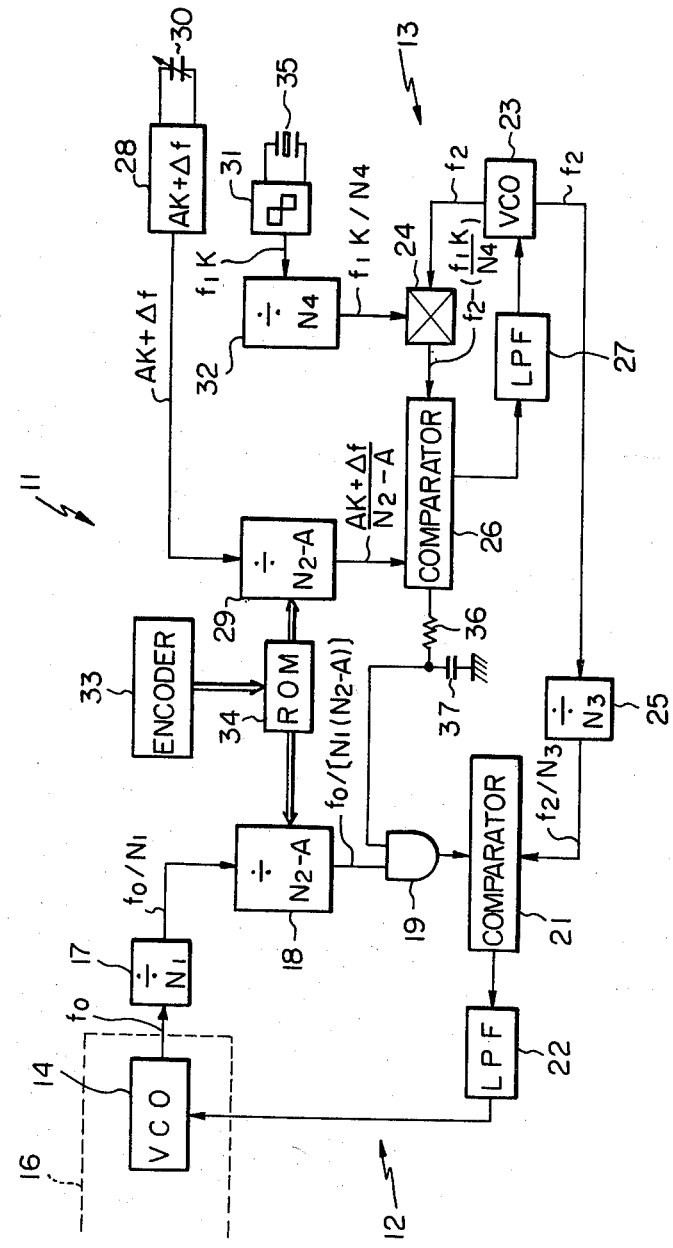
FIG. 1 is a block diagram of a first embodiment of a local oscillator circuit according to the present invention.

Referring now to FIG. 1 of the drawing, a local oscillator circuit embodying the present invention is generally designated by the reference numeral 11 and comprises a first phase locked loop 12 and a second phase locked loop 13. The first phase locked loop 12 comprises a voltage controlled oscillator (VCO) 14 which produces an output frequency constituting a local oscillator signal of a television tuner 16. The output of the VCO 14 is passed through a frequency divider 17 having a fixed frequency division ratio of N1, a variable frequency divider 18 having a frequency division ratio of N2-A and an AND gate 19 to an input of a phase comparator 21. The output of the phase comparator 21 is passed through a low pass filter (LPF) 22 to the input of the VCO 14.

The second phase locked loop 13 comprises a voltage controlled oscillator 23 having an output connected to another input of the phase comparator 21 through a frequency divider 25 having a fixed frequency division ratio of N3. The output of the VCO 23 is also connected through an adder 24 to an input of a phase comparator 26, the output of which is connected through a low pass filter 27 to the control input of the VCO 23.

A variable frequency oscillator 28 comprising a variable capacitor 30 or the like generates a frequency $AK + \Delta f$ which is fed through a frequency divider 29 having the same frequency division ratio as the frequency divider 18 to another input of the phase comparator 26. A crystal controlled base frequency oscillator 31 has a crystal 35 and produces a base frequency which is divided by a frequency divider 32 having a fixed frequency division ratio of N4 to another input of the adder 24.

An encoder 33 comprising a plurality of switches and gates which are not shown in detail, has an output which is connected to an input of a read only memory (ROM) 34. The output of the ROM 34 is connected to inputs of the frequency dividers 18 and 29.

In response to depression of a switch corresponding to a selected television channel, the encoder 33 produces a corresponding binary or binary-coded-decimal (BCD) signal designating a particular address in the ROM 34. The contents of the address are applied to the frequency dividers 18 and 29 to set the frequency division ratio thereof. Taking as an example the United States television standards, the local oscillator frequencies for channels 2 to 83 are 101 MHz to 931 MHz. For channel 2 the frequency division ratio of the frequency dividers 18 and 29 will be set to 101. For channel 83 the frequency division ratio will be set to 931. Although only one VCO 14 is illustrated, two such VCO's may be provided; one for VHF and one for UHF with an appropriate switch for selecting the VHF or UHF VCO.

The output signal of the VCO 14 constitutes the local oscillator signal of the circuit 11 and is designated as f0. This frequency f0 is divided by the frequency divider 17 which produces an output having a frequency f0/N1. This frequency is further divided by the variable frequency divider 18 which produces an output frequency equal to f0/[N1(N2-A)] which is applied to one of the inputs of the phase comparator 21.

The variable frequency oscillator 28 produces a frequency $AK+\Delta f$ where AK is the center frequency of the oscillator 28 and $\Delta f$ is the deviation from the center frequency AK. It will be understood that $\Delta f$ can be either positive or negative. The frequency divider 29 divides the frequency $AK+\Delta f$ to produce a frequency $(AK+\Delta f)/(N2-A)$ which is applied to one input of the phase comparator 26.

The output frequency of the VCO 23 is designated as f2 and is applied to an input of the adder 24. The base frequency oscillator 31 generates a base frequency f1K which is divided by the frequency divider 32 to provide an output frequency f1k/N4. The adder 24 is constructed to change the sign of the frequency f1K/N4 to produce a frequency $-(f1K/N4)$ which is algebraically added to the frequency f2 to produce a frequency $f2-(f1K/N4)$ which is applied to the other input of the phase comparator 26.

The first phase locked loop 12 functions in a known manner to maintain the output frequency of the AND gate 19 which is applied to one input of the comparator 21 in lock with the frequency f2/N3 which is applied to the other input of the comparator 21. The frequency f2/N3 constitutes the reference frequency of the first phase locked loop 12. Since the output frequency f0 is divided by the ratio N1(N2-A) before application to the comparator 21, the first phase locked loop 12 functions to multiply the input frequency by the loop frequency division ratio. Thus, in the locked condition, the following relation holds true $$\frac{f0}{N1(N2-A)} = \frac{f2}{N3} \quad (1)$$

The frequency $(AK+\Delta f)/(N2-A)$ constitutes the input frequency of the second phase locked loop 13. The following relation holds true when the second phase locked loop 13 is in lock $$\frac{AK+\Delta f}{N2-A} = f2 - \left(\frac{f1K}{N4}\right) \quad (2)$$

Equation (2) may be solved for f2 as follows $$f2 = \frac{f1K}{N4} + \frac{AK+\Delta f}{N2-A} \quad (3)$$

Similarly equation (1) may be solved for f2 as follows $$f2 = \frac{N3f0}{N1(N2-A)} \quad (4)$$

Combination of equations (3) and (4) produces $$\frac{f1K}{N4} + \frac{AK+\Delta f}{N2-A} = \frac{N3f0}{N1(N2-A)} \quad (5)$$

which may be rewritten as $$f0 = \frac{N1}{N3}(N2-A)\left[\left(\frac{f1}{N4}\cdot K\right) + \left(\frac{AK+\Delta f}{N2-A}\right)\right] \quad (6)$$

assuming that N1=N3 and f1=N4=8, equation (6) may be simplified as follows $$f0 = (N2-A)\left(K + \frac{AK+\Delta f}{N2-A}\right) \quad (7)$$

Equation (7) may be further simplified as follows $$f0 = (N2-A)\left(\frac{N2K-AK+AK+\Delta f}{N2-A}\right) \quad (8)$$

$$f0 = N2K + \Delta f \quad (9)$$

Where K is selected to be 1 MHz, equation (9) may be further simplified as follows $$f0 = N2 + \Delta f \quad (10)$$

with f0 being expressed in megahertz.

It will be understood from equation (10) that the output frequency f0 of the local oscillator 11 is equal to the algebraic sum of the frequency division ratio of the frequency dividers 18 and 29 and the offset frequency $\Delta f$, and that this relation holds for all values of f0. In other words, the frequency range of the offset frequency $\Delta f$ is the same for all channels. Since the frequency division ratio of the frequency dividers 18 and 29 is equal to the desired local oscillator frequency divided by K=(1 MHz), the local oscillator circuit 11 is extremely easy to design and embody.

In order to reduce frequency drift of the offset frequency $\Delta f$ to a very low value, the center frequency AK is selected to have a low value compared to the range of the frequency f0. For example, A=13 and AK=13 MHz. It will thus be seen that the present local oscillator circuit 11 achieves the above discussed objects of providing an offset frequency range which is the same for all values of local oscillator output frequency and which has very low frequency drift.

The phase comparator 26 is constructed to produce a lock signal when the second phase locked loop 13 is in lock. This lock signal is applied to another input of the AND gate 19 through a resistor 36. The junction of the resistor 36 and AND gate 19 is grounded through a capacitor 37.

When the second phase locked loop 13 is not in lock, the lock signal is not produced and the AND gate 19 is inhibited. Thus, a frequency of zero is applied to the comparator 21 by the AND gate 19 and the first phase locked loop 12 is disabled. The output frequency f0 will be driven to its maximum value.

However, when the second phase locked loop 13 locks in on the frequency $(AK+\Delta f)/(N2-A)$, the comparator 26 will produce the lock signal which will charge the capacitor 37 through the resistor 36. When the voltage across the capacitor 37 reaches the logically high input level of the AND gate 19, the AND gate 19 will be enabled and will gate the output of the frequency divider 18 to the comparator 21. The provision of the AND gate 19 ensures smooth operation of the oscillator circuit 11 by eliminating erroneous hunting and frequency generation. The resistor 36 and capacitor 37 constitute an integrating circuit which provides a delay which is determined through selection of the values of the resistor 36 and capacitor 37.

The method by which the frequency division ratio of the frequency dividers 18 and 29 is calculated has not been discussed above, and will now be described as follows.

Assuming that the frequency division ratio of the frequency dividers 18 and 29 is designated as X, and it is desired that equation (10) hold true, the following relation may be applied, where K=1 MHz.

$$f0 = X(1 + A/X) \quad (11)$$

It is further assumed in equation (11) that the offset frequency $\Delta f$ is zero.

The frequency divider 18 functions to multiply the term [1(A/X)] by the factor (X). The factor (1) in the term [1+(A/X)] represents the base frequency of the base frequency oscillator 31 divided by the frequency divider 32. The divisor (x) in the term [1+(A/X)] indicates that the frequency divider 29 divides the output frequency of the variable frequency oscillator 28 by the factor (x). Thus, the output frequency of the oscillator 28 is divided by the divider 29 and multiplied by the divider 18 by the same factor (X), and therefore appears in the output frequency f0 at a multiplication (division) ratio of unity.

It is further desired that with the offset frequency $\Delta f$ equal to zero that the output frequency f0 expressed in megahertz be equal to the frequency division ratio X. Thus, for $\Delta f = 0$, $$f0 = N2 \quad (12)$$

Combining equations (11) and (12) Produces $$N2 = X(1 + A/X) \quad (13)$$

Solving equation (13) for X produces $$N2 = X(X + A/X) \quad (14)$$

$$X = N2 - A \quad (15)$$

By this procedure the frequency division ratio N2-A indicated above is obtained in the final equation (15).

Figure 2:
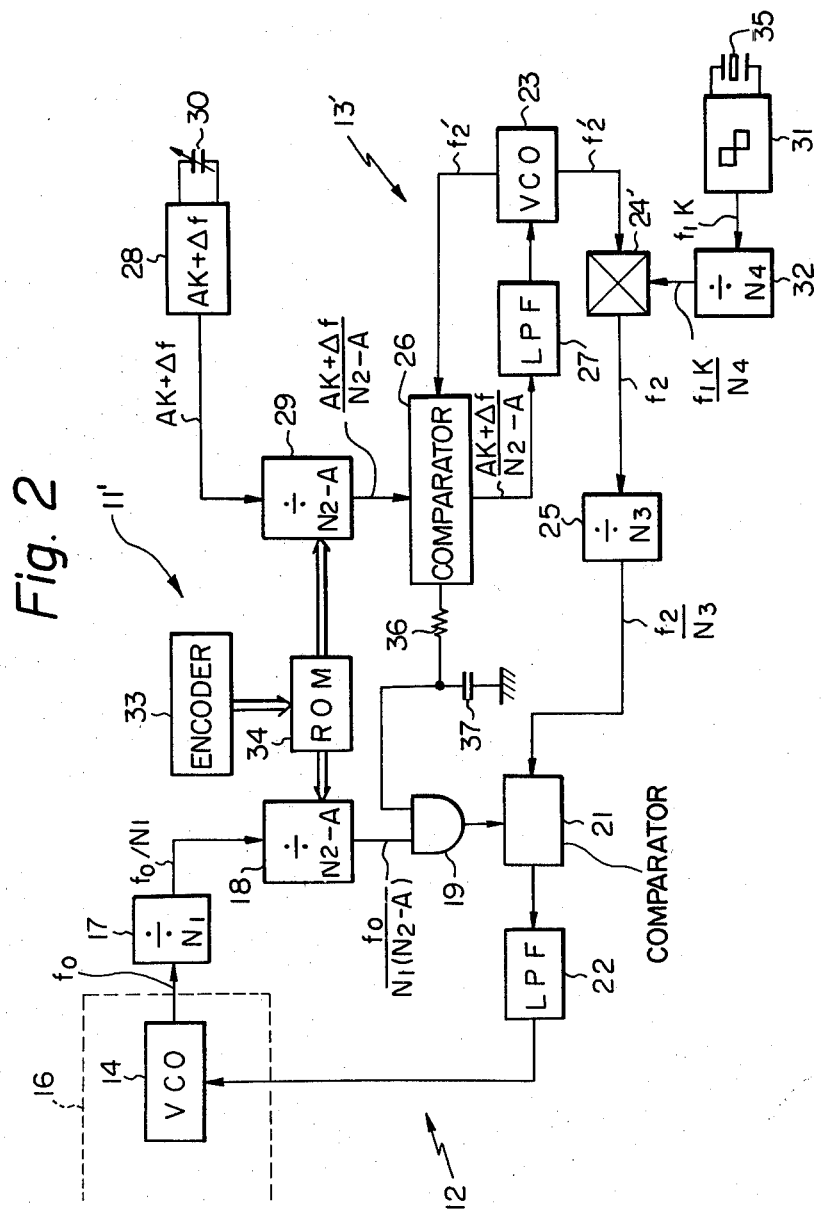
FIG. 2 is similar to FIG. 1 but shows a second embodiment.

FIG. 2 illustrates another embodiment of the present invention which is designated as 11'. Like elements are designated by the same reference numerals. In the local oscillator circuit 11' the adder 24 is replaced by an adder 24' connected between the output of the VCO 23 and the frequency divider 25. In this case, the VCO 23 produces an output frequency f2' which is equal to (AK+$\Delta f$)/(N2-A) since it locks on the output frequency of the frequency divider 29. The adder 24' functions to add the output frequency f1K/N4 to the output frequency of the VCO 23 to produce the frequency f2 indicated in equation (2). The only differences between the circuits 11 and 11' are that the adder 24' is outside of a second phase locked loop 13' and does not change the sign of the frequency f1K/N4 from positive to negative prior to addition with the frequency (AK+$\Delta f$)/(N2-A) at the other input thereof.

Various modifications will become possible for those skilled in the art after receiving the teachings of the present disclosure without departing from the scope thereof. For example, the frequency dividers 17 and 25 may be eliminated or may have different frequency division ratios. In the latter case, the offset frequency $\Delta f$ will produce a proportional, rather than a unity change in the frequency f0. The other frequencies and division ratios may be varied as desired.

It will be further understood by those skilled in the art that the present local oscillator circuits comprise digital elements which may be fabricated at low cost on a commercial production basis. Utilizing large scale integration (LSI) technology, an entire local oscillator circuit except for the channel selection switches may be embodied as a single integrated circuit chip.

What is claimed is:

1. An oscillator circuit including a first phase locked loop having a first voltage controlled oscillator and a first phase comparator, the improvement comprising:
    a second phase locked loop having a second phase comparator and having an output connected to an input of said first phase comparator;
    a first frequency divider provided in said first phase locked loop for dividing an output frequency of said first voltage controlled oscillator;
    a variable frequency oscillator; and
    a second frequency divider having the same frequency division ratio as said first frequency divider and connected between an output of the variable frequency oscillator and an input of said second phase comparator.

2. An oscillator circuit according to claim 1, said first and second frequency dividers being variable.

3. An oscillator circuit according to claim 1, the output frequency of said variable frequency oscillator being lower than the lower limit of the output frequency range of said first phase locked loop.

4. An oscillator circuit according to claim 1, further comprising a base frequency oscillator and adder means connected to the input of said second phase comparator for combining the base frequency of said base frequency oscillator and the output frequency of said second phase locked loop.

5. An oscillator circuit according to claim 4, said adder means being provided in said second phase locked loop and arranged to subtract said base frequency from the output frequency of said second phase locked loop.

6. An oscillator circuit according to claim 1, further comprising a base frequency oscillator and adder means connected between the output of said second phase locked loop and an input of said first phase locked loop for combining the base frequency of said base frequency oscillator with the output of said second phase locked loop.

7. An oscillator circuit according to claim 1, 4 or 6 said variable frequency oscillator having a center frequency AK, the frequency division ratio of said first and second frequency dividers being N-A, wherein K is said base frequency, A and K are constants and N is variable.

8. An oscillator circuit according to claim 7, wherein K equals 1 MHz.

9. An oscillator circuit according to claim 1, said second phase locked loop producing a lock signal, the oscillator circuit further comprising gate means provided in said first phase locked loop and having an input connected to an output of said first frequency divider, said lock signal being adapted to enable said gate means.

10. An oscillator circuit according to claim 1, said first phase locked loop further comprising a first low pass filter connected between said first phase comparator and said first voltage controlled oscillator, said first frequency divider being connected between said first voltage controlled oscillator and said first phase comparator, said second phase locked loop comprising a second voltage controlled oscillator and a second low pass filter connected between said second phase comparator and said second voltage controlled oscillator, an output of said second voltage controlled oscillator being connected to an input of said first phase comparator.

* * * * *